United States Patent
Wickett

(10) Patent No.: US 7,234,950 B1
(45) Date of Patent: Jun. 26, 2007

(54) ELECTRICAL CONNECTOR ASSEMBLY

(75) Inventor: Paul Wickett, Northville, MI (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/411,612

(22) Filed: Apr. 26, 2006

(51) Int. Cl.
*H01R 12/00* (2006.01)

(52) U.S. Cl. .......................... 439/78; 439/247

(58) Field of Classification Search ................. 439/78, 439/76.1, 247, 248, 559, 736, 926
See application file for complete search history.

(56) References Cited

U.S. PATENT DOCUMENTS

| | | | |
|---|---|---|---|
| 5,002,497 A | 3/1991 | Plocek et al. | |
| 5,259,779 A | 11/1993 | Ooya et al. | |
| 5,464,355 A * | 11/1995 | Rothenberger | 439/559 |
| 6,347,950 B1 | 2/2002 | Yokoyama et al. | |
| 6,830,485 B2 | 12/2004 | Koehler et al. | |
| 6,905,349 B1 | 6/2005 | Brandenburg et al. | |
| 6,908,326 B2 | 6/2005 | Shiota et al. | |
| 7,066,751 B2 * | 6/2006 | Chen | 439/247 |
| 2002/0177340 A1 | 11/2002 | Carrodus et al. | |
| 2004/0132322 A1 | 7/2004 | Brandenburg et al. | |
| 2004/0166739 A1 | 8/2004 | Kochler et al. | |
| 2004/0253863 A1 | 12/2004 | Iwasaki | |
| 2005/0018410 A1 | 1/2005 | Brandenburg et al. | |
| 2006/0023441 A1 | 2/2006 | Wickett et al. | |

* cited by examiner

*Primary Examiner*—Khiem Nguyen
(74) *Attorney, Agent, or Firm*—Michael Best & Friedrich LLP

(57) ABSTRACT

An electrical connector assembly that includes a housing, a circuit board at least partially retained within the housing, at least one terminal fixed to the circuit board, and a shroud. The housing defines a housing aperture, and the at least one terminal is accessible through the housing aperture. The shroud is coupled to the housing, and the shroud includes an alignment member configured to fix the at least one terminal relative to the shroud.

33 Claims, 11 Drawing Sheets

ELECTRICAL CONNECTOR ASSEMBLY

BACKGROUND

The present invention relates to electrical connector assemblies.

Electronic systems can include a circuit board having several components that control the electronic system. Typically, the circuit board is retained within a housing. A shroud can extend from the housing, and the shroud can be configured to couple to a mating connector. The mating connector may include terminals that couple to the terminals coupled to the circuit board to facilitate electrical communication between the circuit board and another electronic device.

SUMMARY

Typically, shrouds of electrical connector assemblies have been fixed with respect to the housing such as by mechanical connections, by molding the shroud over the housing, or by using a PCB header. In most applications, the terminals are fixed to the circuit board and then positioned within the shroud at a specific distance from the inner walls of the shroud. The terminals are positioned with respect to the inner walls of the shroud so that the mating terminals are aligned with and able to receive the terminals coupled to the circuit board while allowing the shroud to couple with the mating connector. If other portions of the circuit board are to be aligned with other components, this can necessitate tight assembly tolerances that can increase the cost of the electrical connector assembly and the circuit board. Therefore, it is desirable to have a shroud that is able to align and fix the terminals with respect to the inner walls of the shroud while still allowing the shroud to move or float with respect to the housing in order to facilitate aligning other portions of the circuit board with other components of the electronic system.

Furthermore, it is desirable for components of the electrical connector assembly, such as the shroud, to be stand alone, generic components for use in different applications. Generally, a different shape or style housing is used for different applications of the electronic system and it is desirable to create a generic shroud that can be used with multiple shapes and styles of housings.

In one embodiment, the invention provides an electrical connector assembly that includes a housing, a circuit board at least partially retained within the housing, at least one terminal fixed to the circuit board, and a shroud. The housing defines a housing aperture, and the at least one terminal is accessible through the housing aperture. The shroud is coupled to the housing, and the shroud includes an alignment member configured to fix the at least one terminal relative to the shroud.

In another embodiment the invention provides an electrical connector assembly that includes a housing, at least one terminal, and a shroud. The housing defines a housing aperture, and the at least one terminal is accessible through the housing aperture. The shroud is generally aligned with the housing aperture and is movable relative to the housing to facilitate positioning the shroud relative to the at least one terminal.

In yet another embodiment the inventions provides a shroud for use with an electrical connector assembly having at least one terminal. The shroud includes a wall defining a shroud aperture, and an alignment member configured to fix the at least one terminal relative to the wall.

Other aspects of the invention will become apparent by consideration of the detailed description and accompanying drawings.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

DETAILED DESCRIPTION

Figure 1:
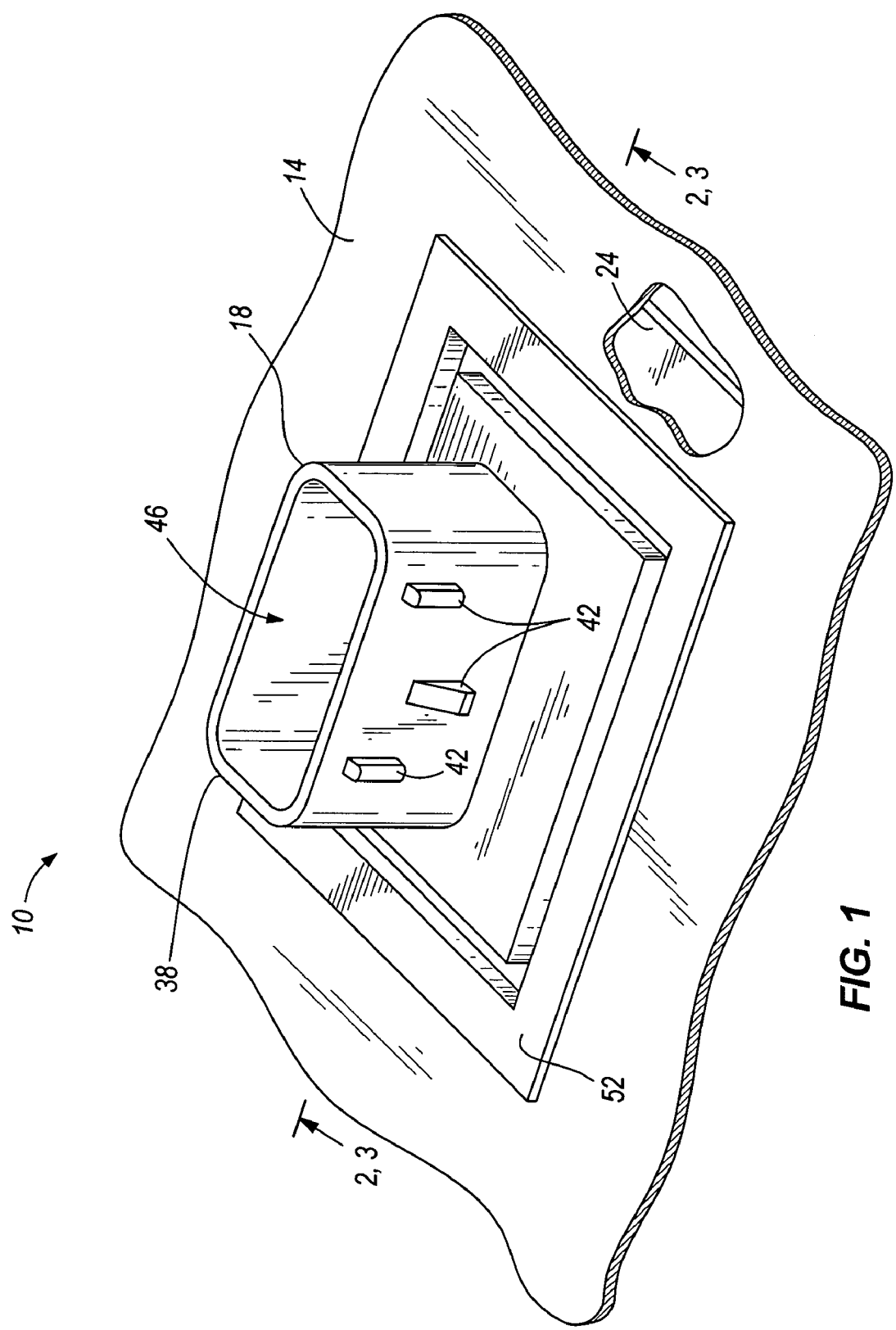
FIG. 1 is a perspective view of an electrical connector assembly embodying the present invention.
Figure 2:
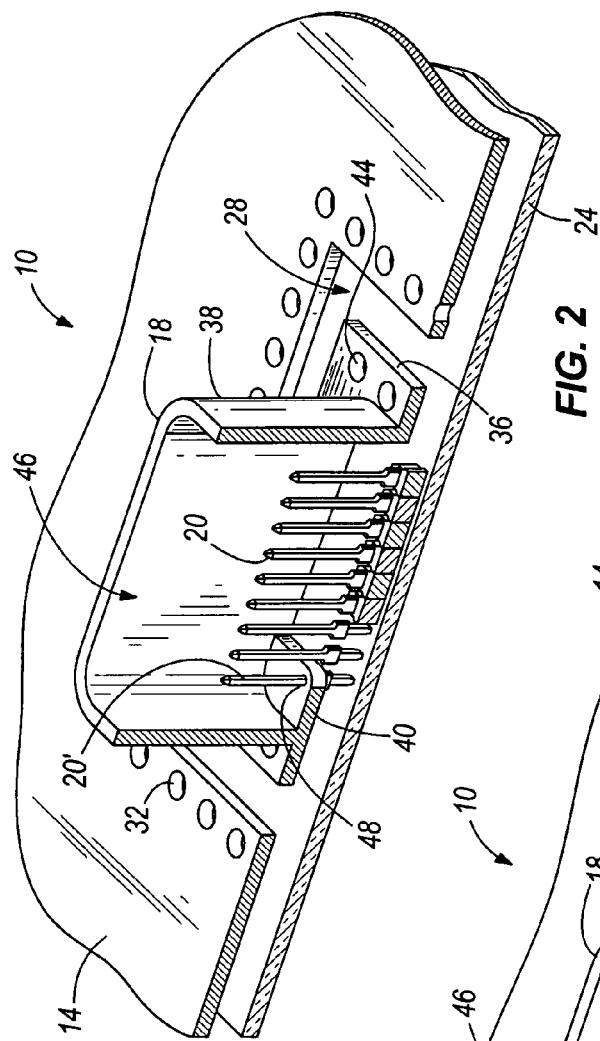
FIG. 2 is a cross-section view of the electrical connector assembly taken along line 2-2 of FIG. 1 with a portion of the electrical connector assembly removed for clarity.

FIGS. 1 and 2 illustrate an electrical connector assembly 10 that includes a housing 14, a shroud 18, and terminals 20. The terminals 20, which are terminal pins in the illustrated construction, are coupled to a circuit board 24. The circuit board 24 can be any suitable circuit board such as FR-4 printed circuit board and the like.

As understood by one of ordinary skill in the art, the circuit board 24 can be interconnected with other electrical components. For example, in one construction the circuit board 24 can form a portion of an electronic control unit utilized by an automobile. In other constructions, the circuit board 24 can be utilized in any desired application.

Referring to FIG. 2, the housing 14 generally encloses, partially encloses, or retains the circuit board 24, and the housing 14 defines a housing aperture 28. A plurality of optional molding apertures 32, the purpose of which will be discussed below, extend through the housing 14 and are located around the outer edge of the housing aperture 28.

In one construction, the housing 14 has a geometry that minimizes the air volume located within the housing 14. Minimizing the air volume located within the housing minimizes the amount of air available to insulate components located within the housing 14. In some constructions, the components within the housing 14 can generate heat. Therefore, it is desirable to minimize the amount of air within the housing that can insulate or retain heat within the housing. The geometry of the housing 14 can also be arranged to maximize contact with the circuit board 24 in order minimize the thermal resistance at the interface between the housing 14 and the circuit board 24. Furthermore, the housing 14 can be colored black to maximize heat transfer through radiation. Although not illustrated, the housing 14 may include fins, bumps, or other surface features to maximize the exterior surface area of the housing 14 in order to maximize heat transfer through convection.

The housing 14 can be formed from any suitable material, and in one construction the housing 14 is formed from a resin such as plastic resins, urethane resins, thermal plastic elastomeric resins (TPE), and the like. The resins can include virgin, recycled, filled, unfilled, commodity, engineered resins, etc. In other constructions, the housing 14 can be formed from metals, such as wrought aluminum, steel, die cast aluminum alloys, and the like. In yet other constructions, the housing 14 can be formed from glass filled polybutylene terephthalate (PBT), glass filled nylon, a metal-filled resin or any metal alloy, which can include thixotropic alloys of magnesium and aluminum, and powder metals.

The housing 14 can be formed using any suitable method, such as injection molding, stamping, die casting, and the like. In other constructions, the housing 14 can be molded, such as by thixomolding, insert molding, over-molding, including low-pressure overmolding, multi-shot injection molding, etc.

Figure 1A:
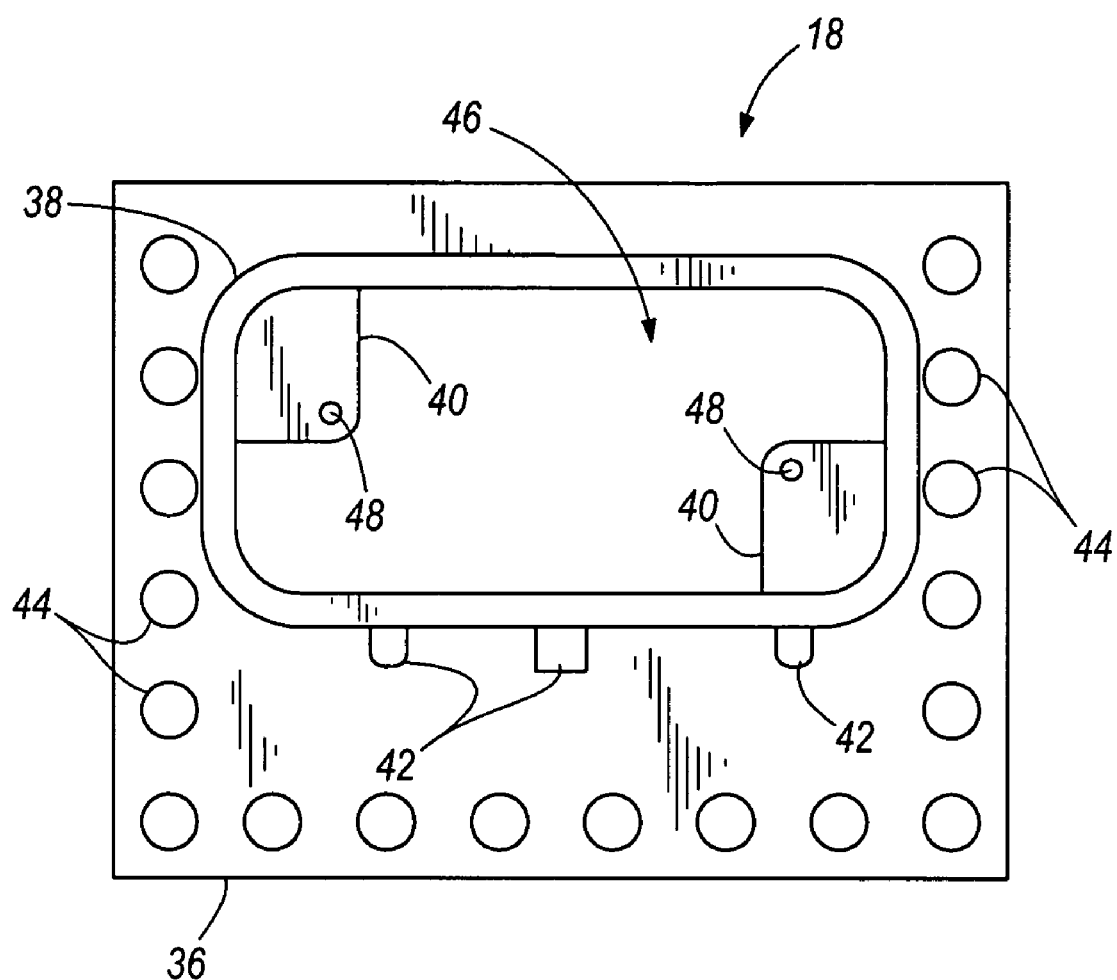
FIG. 1a is a top view of a shroud of the electrical connector assembly of FIG. 1.

Referring to FIGS. 1, 1a, and 2, the shroud 18 includes a flange 36, a wall 38 extending from the flange 36, alignment members 40, and bosses 42 on the wall 38. The illustrated flange 36 includes optional shroud molding apertures 44, the purpose of which will be discussed below. The wall 38 extends from the flange 36, generally normal to the flange 36. The illustrated wall 38 is continuous, such that the wall defines a shroud aperture 46. The bosses 42 extend from an exterior surface of the wall 38, and as is understood by one of skill in the art, the bosses 42 are utilized to couple the shroud 18 of the electrical connector assembly 10 to a shroud, or other similar device, of a mating electrical connector assembly.

In the illustrated embodiment, the alignment members 40 of the shroud 18 extend from an interior surface of the wall 38 and are inwardly-extending continuations of the flange 36. The illustrated alignment members 40 each include an alignment aperture 48. The alignment aperture 48 extends through the alignment member 40 and is sized to receive one of the terminals 20'. Insertion of the terminal 20' into a respective alignment aperture 48 provides a piloting function to position the terminals 20 in proper relation to the shroud wall 38, as will be discussed below. It should be understood that the illustrated alignment member 40 is just one possible construction of the alignment member, and in other constructions the alignment member can take other suitable shapes and forms. For example, while the illustrated alignment member 40 utilizes the end terminal 20', in other constructions the alignment member can take other forms and can utilize other terminals 20 or other portions of the electrical connector assembly (e.g., other components or geometry on the circuit board 24) to align the shroud with respect to the terminals.

The shroud 18 can be formed from any suitable material, and in one construction the shroud 18 is formed from resins such as plastic resins, urethane resins, thermal plastic elastomeric resins (TPE), and the like. The resins can include virgin, recycled, filled, unfilled, commodity, engineered resins, etc. In other constructions, the shroud 18 can be formed from glass filled polypropylene, a glass filled polycarbonate and acrylonitrile butadiene styrene blend, and the like. In yet other constructions, the shroud 18 can be formed from metal-filled resins, thixotropic alloys of magnesium, other metals such as wrought aluminum, steel, die cast aluminum alloys, and the like.

Referring to FIGS. 1-4, to assemble the illustrated electrical connector assembly 10, the terminals 20 are coupled to the circuit board 24. In one method of assembly, the terminals 20 are soldered to the circuit board 24 using a reflow solder process, such as by using pin-in-paste soldering. Alternatively, the terminals 20 can be coupled to the circuit board 24 using any suitable connection technique.

Figure 3:
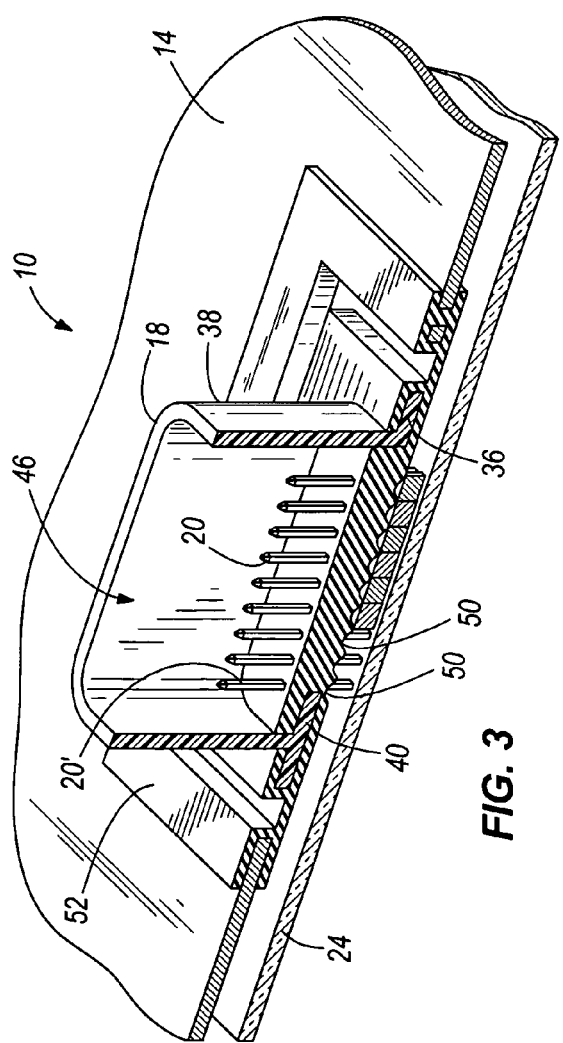
FIG. 3 is a cross-section view of the electrical connector assembly taken along line 3-3 of FIG. 1.
Figure 4:
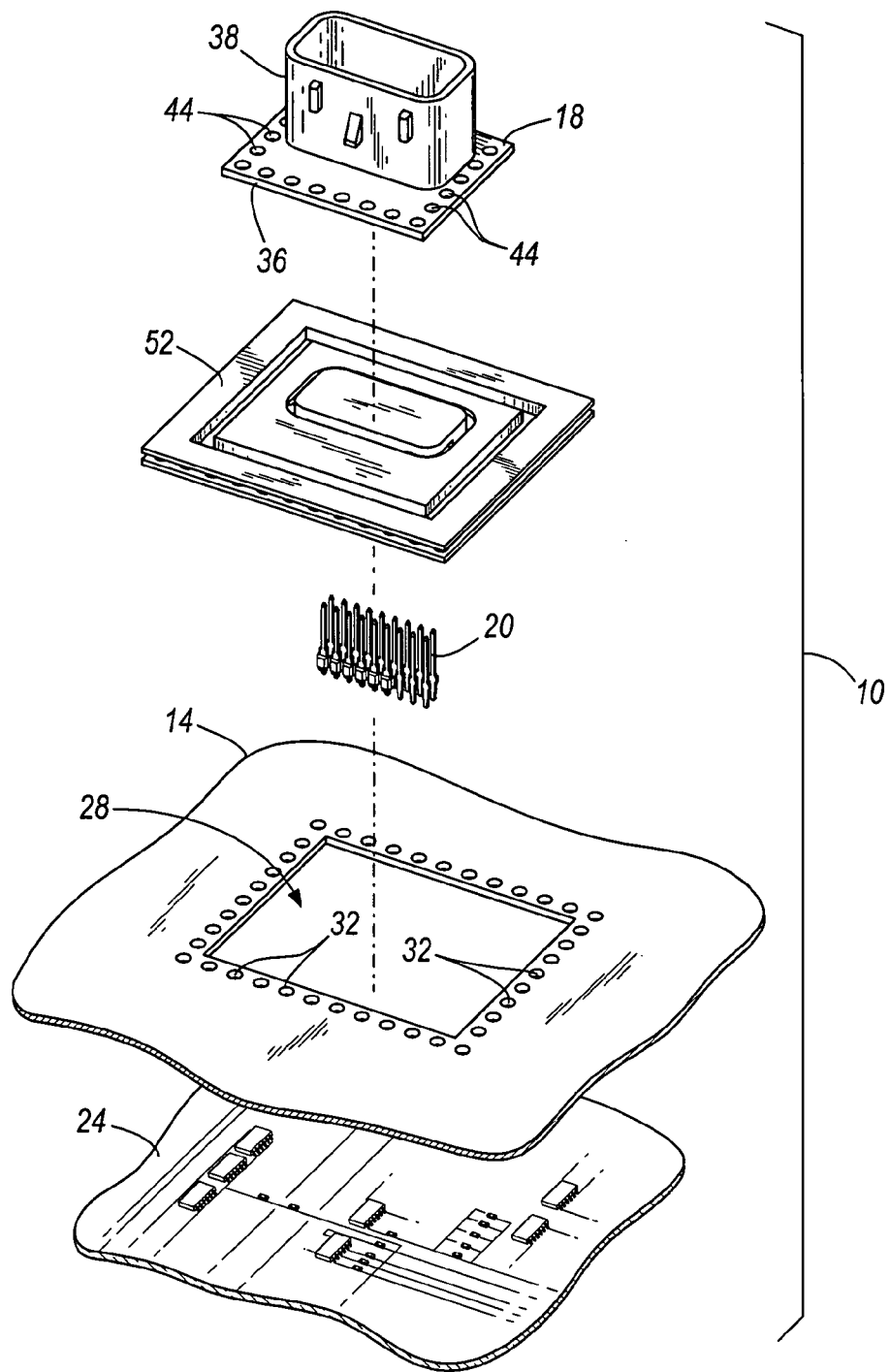
FIG. 4 is an exploded view of the electrical connector assembly of FIG. 1.

Referring to FIG. 3, the shroud 18 is molded into the housing aperture 28 using a molding material 52. In one construction, the material 52 utilized to mold the shroud 18 to the housing 14 is a thermal elastomeric resin (TPE) having elongation properties similar to rubber. In other constructions, any suitable material can be used to mold the shroud 18 to the housing 14. The molding material 52 allows the shroud 18 to move or float with respect to the housing 14, while creating a seal between the housing 14 and the shroud 18. The shroud 18 can be molded to the housing 14 using any suitable molding process, such as insert molding, overmolding, multi-shot molding, and the like.

Referring to FIGS. 2 and 3, when the shroud 18 is molded into the housing aperture 28, the molding material 52 flows through the molding apertures 32, 44 of the housing 14 and the shroud 18, thereby strengthening the connection between the shroud 18 and the housing 14.

After the shroud 18 is molded within the housing aperture 28, the terminals 20 are pierced through the mold material 52 such that the terminals 20' pierce through the mold material 52 and are received in the alignment apertures 48. In the illustrated construction, guides 50 are formed in the mold material 52 during molding to facilitate aligning the end terminals 20' with the alignment apertures 48. The illustrated guides 50 are indentations in the mold material 52. Therefore, the mold material 52 is generally thinner at the guides 50, which facilitates piercing all of the terminals 20 through the mold material 52. In other constructions, guides could be located at only one or two positions in alignment with the alignment apertures. In yet other constructions, indicia or other guiding features can be used.

In the illustrated construction, the material 52 utilized to mold the shroud 18 to the housing 14 is also present within the shroud aperture 46. Therefore, the material 52 seals the area between the terminals 20 and the wall 38 of the shroud 18 generally inhibiting materials such as dust, dirt, water, and the like from entering the housing 14 through the shroud aperture 46. In other constructions, the mold material 52 may not be located within the shroud aperture 46. In such constructions, a separate seal can be located within the shroud aperture to inhibit material from entering the housing through the shroud aperture, and yet other constructions may omit a seal within the shroud aperture.

With two of the terminals 20' inserted through the apertures 48 in the alignment member 40, the two terminals 20' are positionally fixed with respect to the shroud 18, and because the remaining terminals 20 are fixed to the circuit board 24, all of the terminals 20, 20' are positionally fixed with respect to the shroud 18 and with respect to the inner surface of the shroud wall 38 to allow the terminals of a mating connector to receive the terminals 20 while allowing the mating connector to couple to the shroud 18. If the terminals 20 are not properly aligned with the inner surface of the shroud wall 38, the electrical connector assembly 10 may be unable to couple with a mating connector.

The mold material 52 achieves the sealing discussed above and also allows the shroud 18 to move or float laterally with respect to the housing 14 in order to facilitate aligning and inserting the terminals 20' through the alignment apertures 48 in cases where the terminals 20' are not perfectly aligned with the alignment apertures 48. Allowing the shroud 18 to float with respect to the housing 14 can be helpful if another portion of the circuit board 24 is being aligned with the housing 14, such as if the housing includes a second electrical connector assembly.

Figure 5:
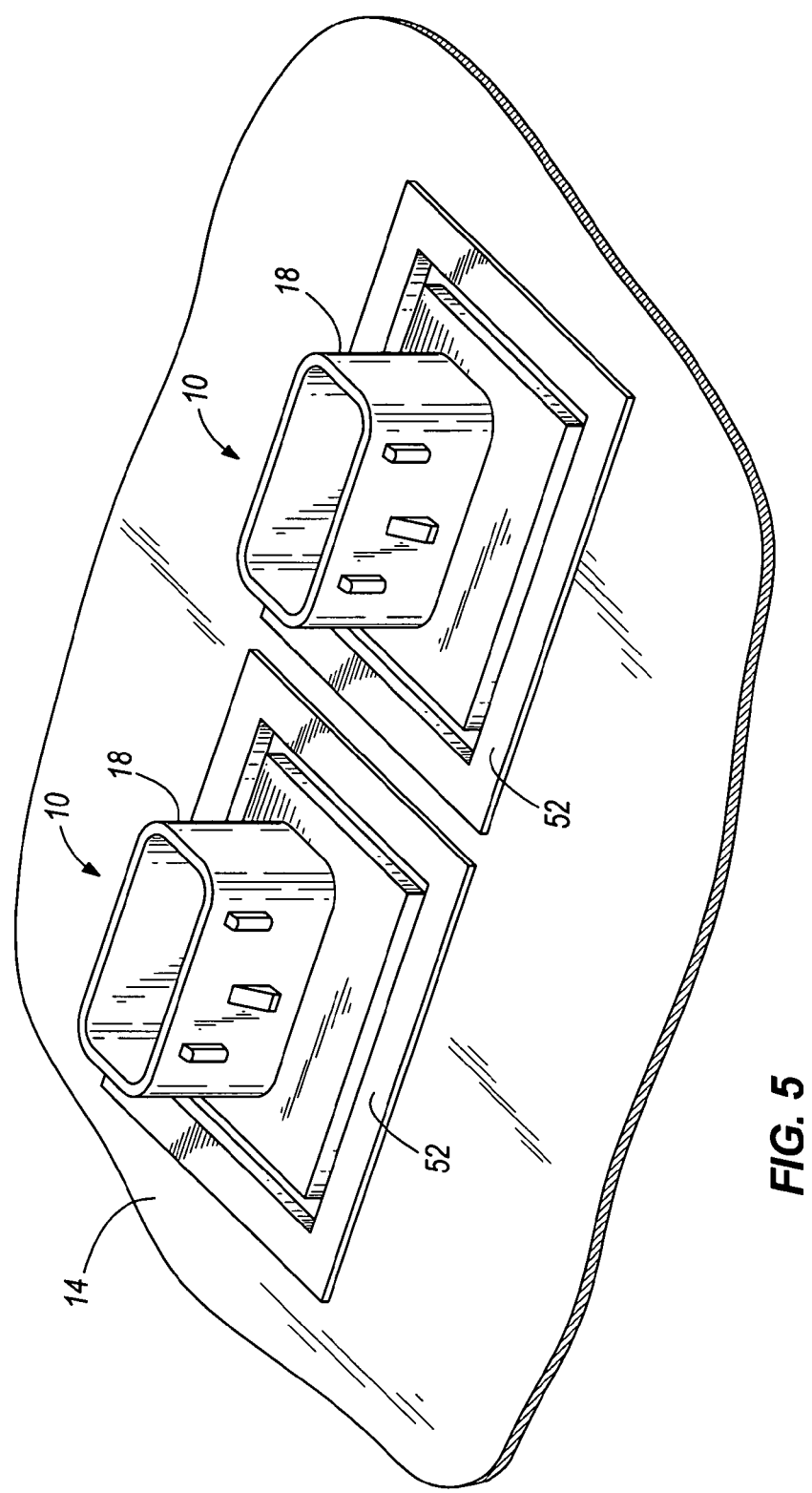
FIG. 5 illustrates two of the electrical connector assemblies of FIG. 1 utilized with a single housing.

Referring to FIG. 5, multiple electrical connector assemblies 10 can share a common housing 14. The electrical connector assemblies 10 of FIG. 5 are generally identical to the electrical connector assembly 10 of FIGS. 1-4. Therefore, like parts have been given the same reference numbers. The electrical connector assemblies 10 of FIG. 5 are assembled similarly to the electrical connector assembly of FIGS. 1-4. The molded material 52 allows the shrouds 18 to float or move with respect to the housing 14 to facilitate aligning the terminals 20', which are fixed to the circuit board 24, with the alignment apertures 48 of the respective shroud alignment members 40. While FIG. 5 illustrates two electrical connector assemblies 10, it should be understood that any number of electrical connector assemblies can utilize a common housing, and that the invention makes alignment and assembly of such multiple connector assembly constructions easier and more flexible. Furthermore, allowing the shrouds 18 to float with respect to the housing 14 allows the assembly tolerances of the locations of the terminals 20 to be relaxed. As is understood by one of skill in the art, relaxed or increased tolerances generally reduces the cost of manufacturing and assembling the electrical connector assembly 10.

Figure 6:
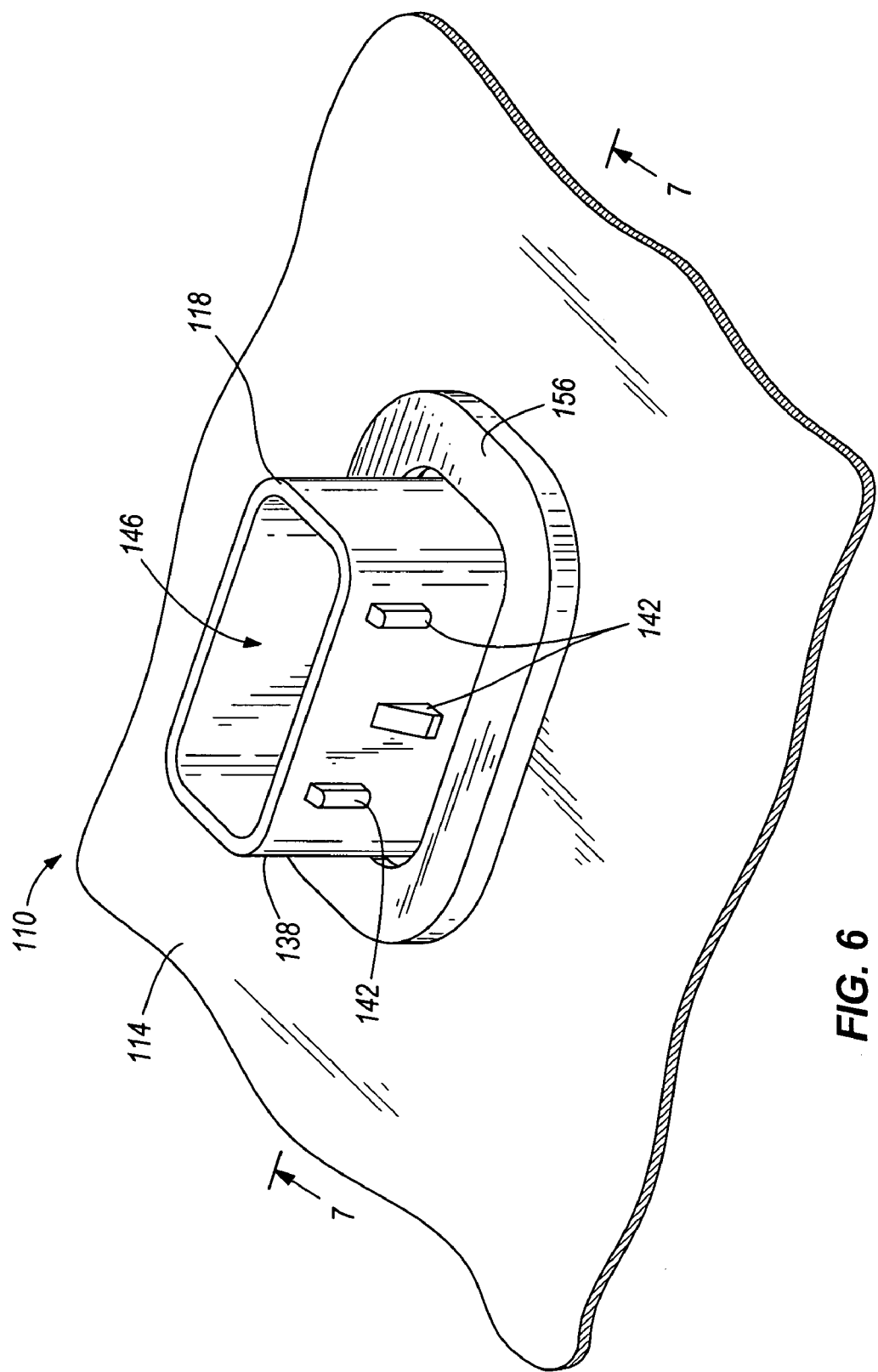
FIG. 6 is a perspective view of an alternative embodiment of the electrical connector assembly of FIG. 1.
Figure 7:
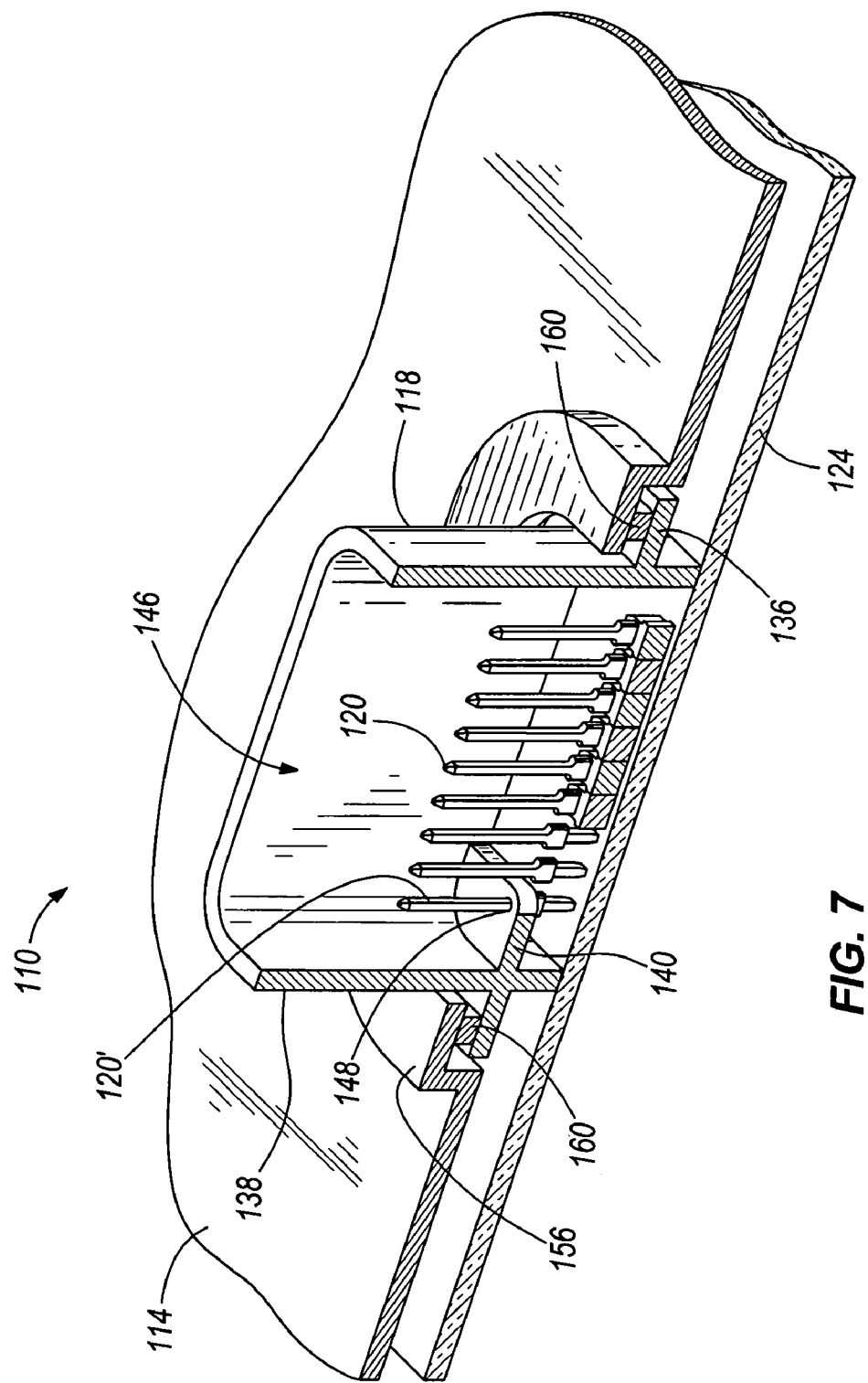
FIG. 7 is a cross-sectional view of the electrical connector assembly taken along line 6-6 of FIG. 7.
Figure 8:
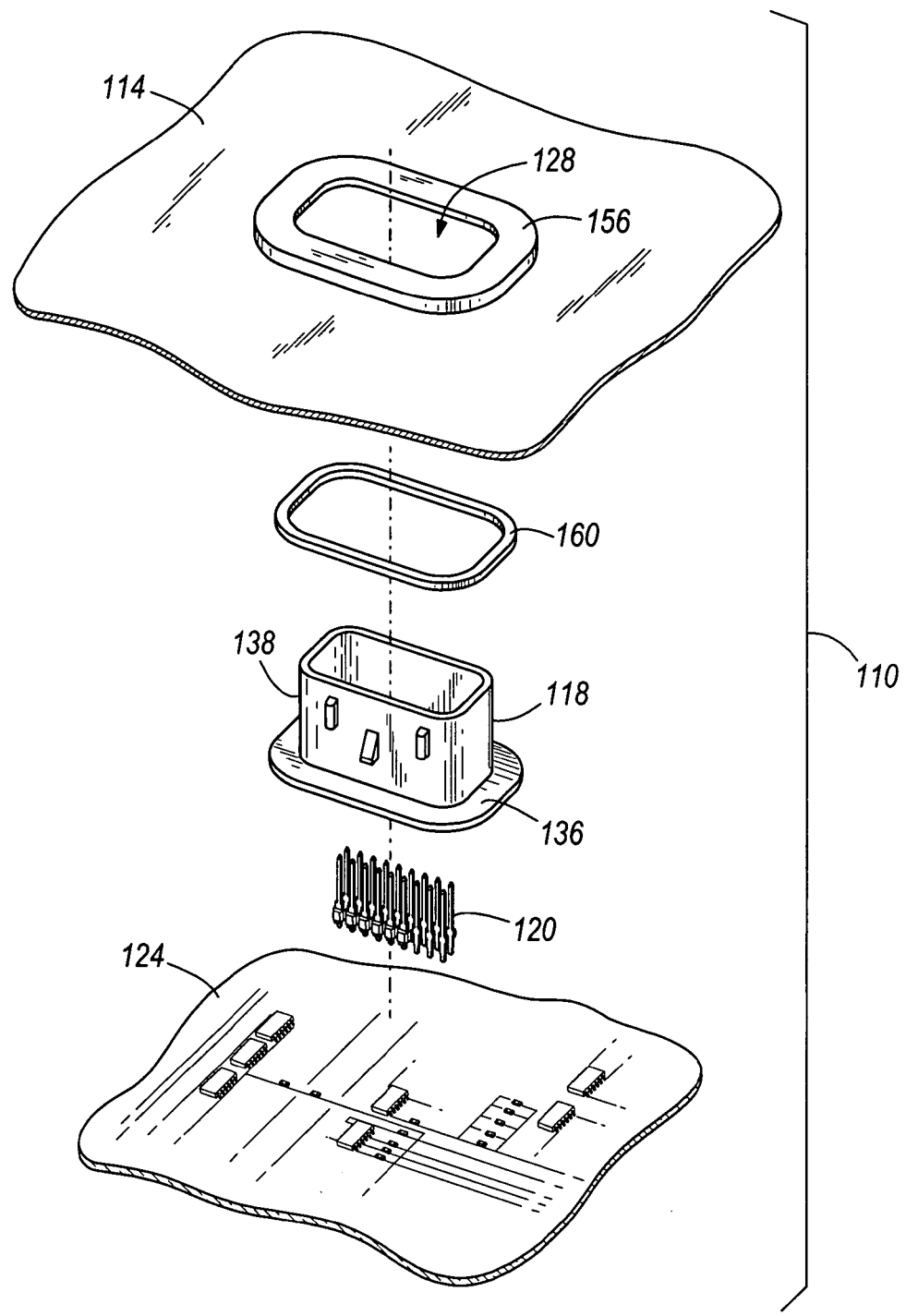
FIG. 8 is an exploded view of the electrical connector assembly of FIG. 6.

FIGS. 6-8 illustrate an alternative construction of the electrical connector assembly 10 of FIGS. 1-5, and similar parts have been given similar reference numbers in the one-hundred series. Therefore, only differences between the electrical connector assembly 10 of FIGS. 1-4 and the electrical connector assembly 110 of FIGS. 6-8 will be discussed.

The electrical connector 110 includes the housing 114 that includes a shoulder 156. In illustrated construction, the shoulder 156 is integrally formed with the housing 114 (e.g., during injection molding, stamping, etc.), but this need not be the case. Rather than molding the shroud into the housing aperture (FIGS. 1-5), the flange 136 of the shroud 118 is captured by the shoulder 156. The shoulder 156 allows the shroud 118 to move or float laterally with respect to the housing 114, while still retaining the shroud 118 within the housing aperture 128 and generally preventing the shroud 118 from moving in a direction normal to the circuit board 124.

Referring to FIGS. 7 and 8, a seal 160 is located between the shoulder 156 of the housing 114 and the flange 136 of the shroud 118. In the illustrated construction, the seal 156 is a separate component that is placed between the housing 114 and the shroud 118 when the electrical connector assembly 110 is assembled (FIG. 7). In other constructions, the seal 110 can be molded onto the flange 136 of the shroud 118 before the shroud 118 is placed through the housing aperture 128. The seal 160 can be formed from any suitable material, such as rubber, TPE, and the like. Although not illustrated, an optional second seal can be located within the shroud aperture 146 to generally seal the opening between the terminal pins 120 and the interior surface of the shroud wall 138, similar to the mold material 52 of FIGS. 1-4. In one construction, the second seal can be molded within the shroud aperture 146, and in other constructions, the second seal can be a separate component that is inserted into the shroud aperture 146.

The electrical connector assemblies 10, 110 of FIGS. 1-8 facilitate the use of a stand alone, generic shroud for several different applications of the electrical connector assemblies 10, 110. For example, in different applications of the electrical connector assemblies 10, 110, typically, the housing 14, 114 will take different shapes and forms. However, if the housing 14, 114 includes the housing aperture 28, 128, the shroud 18, 118 can be utilized with each of the different types of housings. Therefore, the electrical connector assemblies 10, 110 provide one shroud 18, 118 that can be used in several different applications of the electrical connector assemblies 10, 110.

Figure 9:
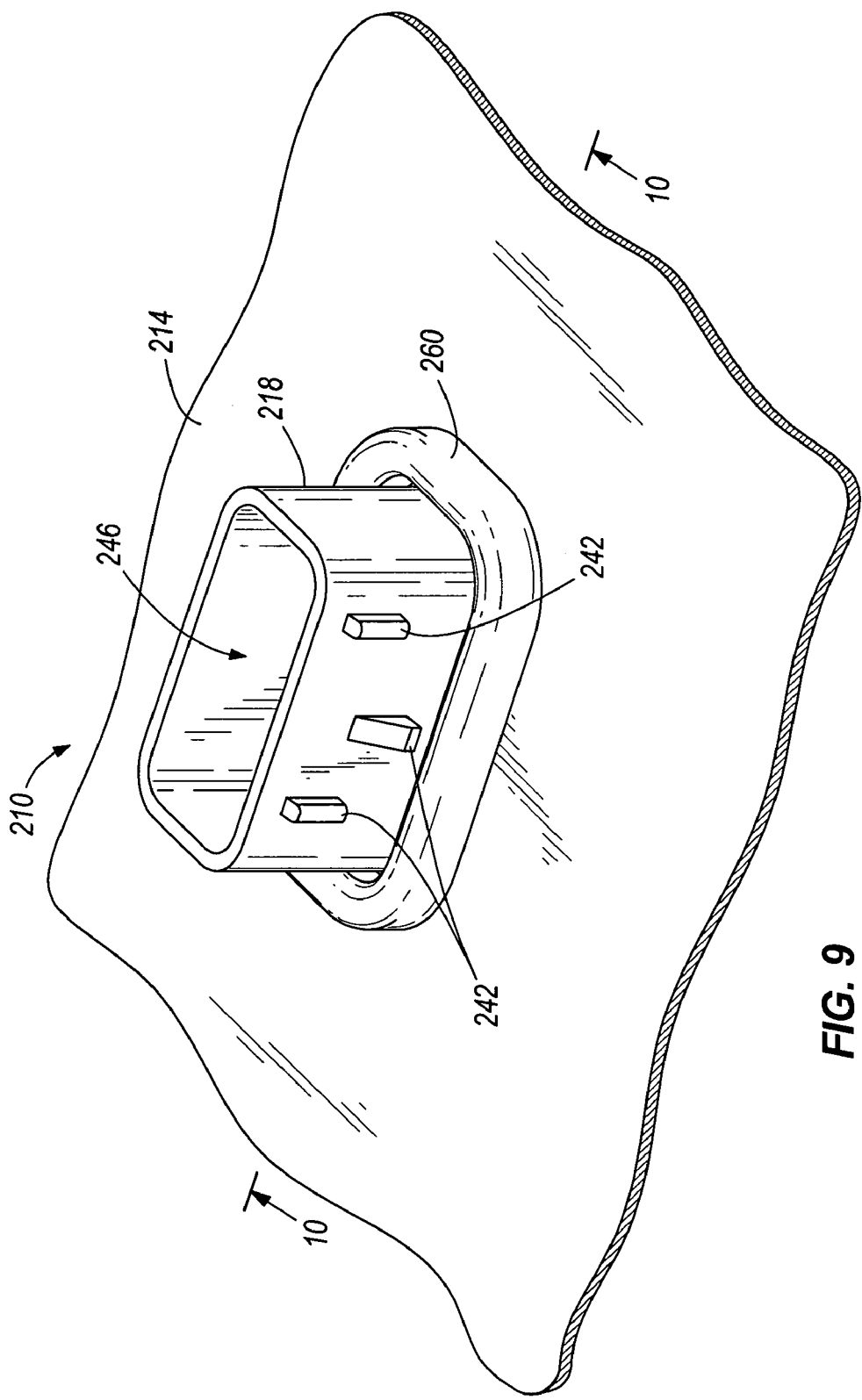
FIG. 9 is a perspective view of yet another alternative embodiment of the electrical connector assembly of FIG. 1.
Figure 10:
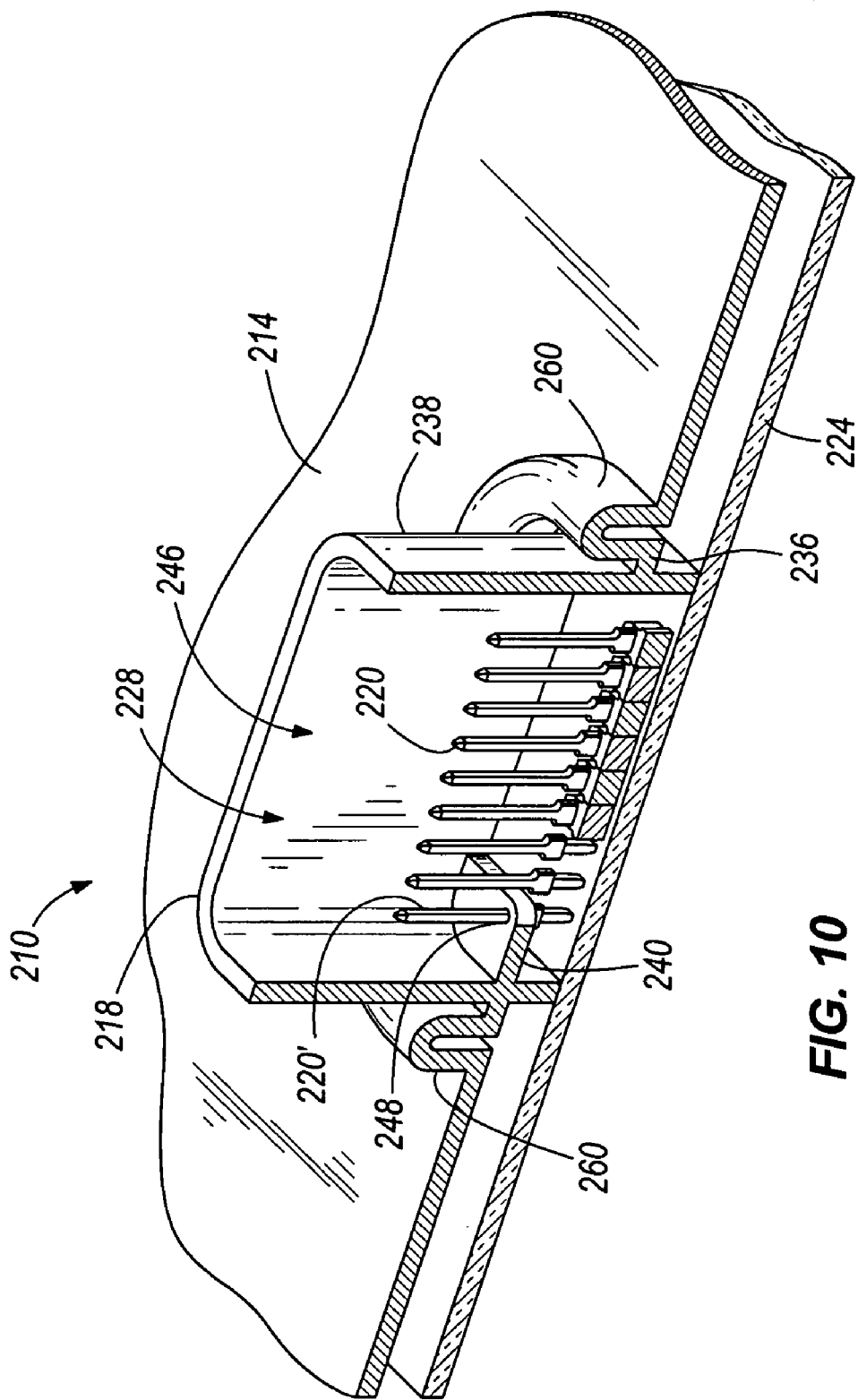
FIG. 10 is a cross-sectional view of the electrical connector assembly taken along line 10-10 of FIG. 9.
Figure 11:
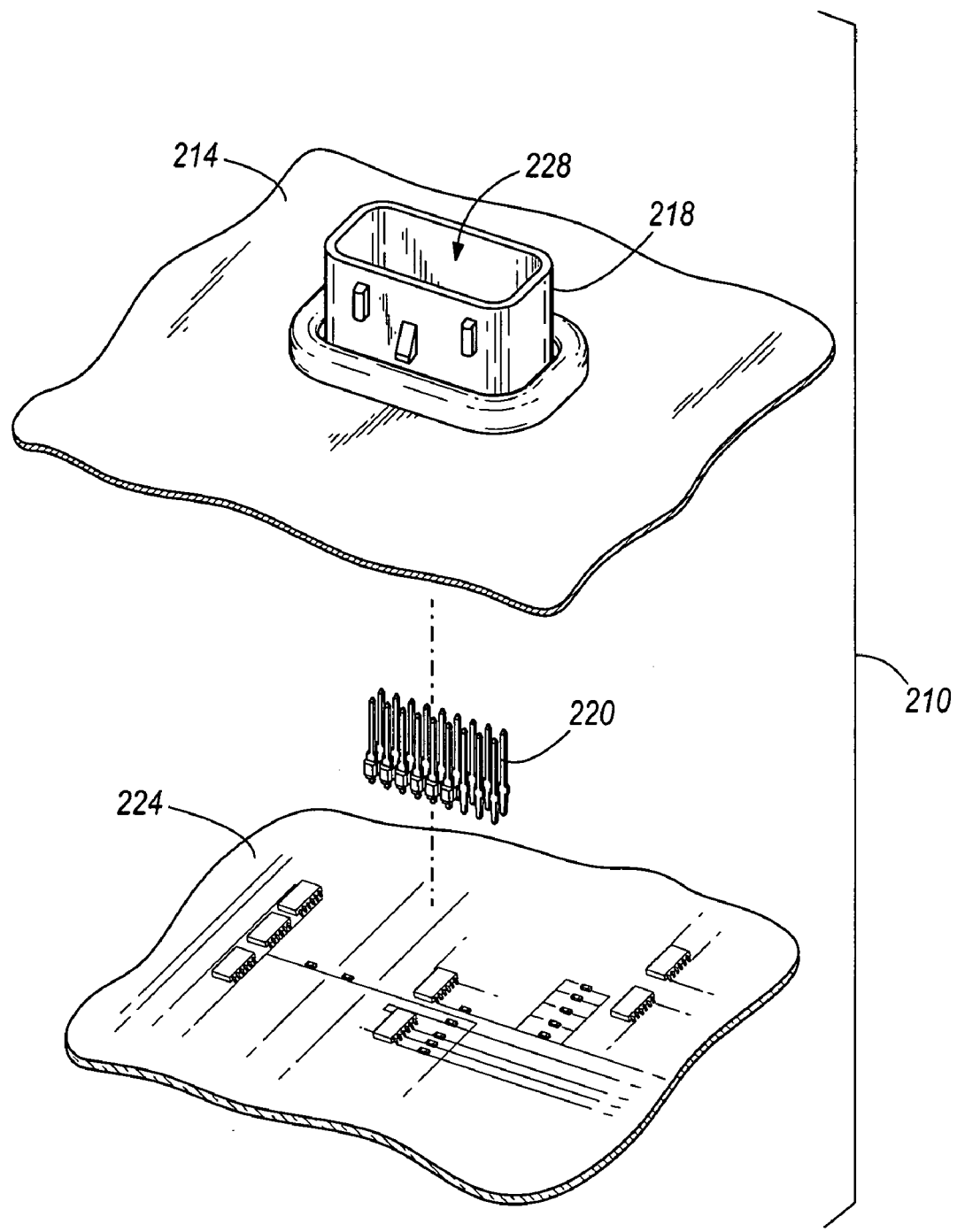
FIG. 11 is an exploded view of the electrical connector assembly of FIG. 9.

FIGS. 9-11 illustrate yet another alternative construction of the electrical connector assemblies 10, 110 of FIGS. 1-8, and similar parts have been given similar reference numbers of the two-hundred series. Therefore, only differences between the electrical connector assemblies 10, 110 of FIGS. 1-8 and the electrical connector assembly 210 of FIGS. 9-11 will be discussed.

In the construction illustrated in FIGS. 9-11, the shroud 218 is integrally formed with the housing 214. The shroud 218 and the housing 214 can be integrally formed using any suitable method, such as the methods described above that can be utilized to form either the shroud 18 or housing 14 of FIGS. 1-5. In other constructions, the shroud 218 can be pre-molded and later coupled to the housing by molding or any suitable process. Furthermore, the shroud 218 and housing 214 can be formed using any suitable material or materials, such as the materials described above that can be utilized to form either the shroud 18 or housing 14 of FIGS. 1-5, which include resins and thixomolded alloys.

Referring to FIG. 10, the flange 236 of the shroud 218 is coupled to a seal 260, which in the illustrated construction is a flexible portion of the housing 214. Therefore, when the terminals 220' are inserted through alignment apertures 248 of the alignment member 240, the shroud 218 is allowed to move or float with respect to the housing 214. Although not illustrated, a second seal can be located within the shroud aperture 246 to generally seal the opening between the terminal pins 220 and the interior surface of the shroud wall 238, similar to the mold material 52 of FIGS. 1-4. In one construction, the second seal can be molded within the shroud aperture 246, and in other constructions, the second seal can be a separate component that is inserted into the shroud aperture 246.

Of course, while the two electrical connector assemblies 10 that share a common housing 14, as illustrated in FIG. 5, are the electrical connector assemblies 10 as described with reference to FIGS. 1-4, it should be understood that any combination of the electrical connector assemblies 10, 110, 210 of FIGS. 1-11 can be configured to utilize a common housing.

Various features and advantages of the invention are set forth in the following claims.

What is claimed is:

1. An electrical connector assembly comprising:
   a housing defining a housing aperture;
   a circuit board at least partially retained within the housing;
   at least one terminal fixed to the circuit board and accessible through the housing aperture; and
   a shroud coupled to the housing, the shroud including an alignment member configured to fix the at least one terminal relative to the shroud.

2. The electrical connector assembly of claim 1, wherein the alignment member is a portion of the shroud having an alignment aperture therein, the at least one terminal received in the alignment aperture.

3. The electrical connector assembly of claim 2, wherein the at least one terminal is a pin.

4. The electrical connector assembly of claim 2, wherein the shroud is movable relative the housing to facilitate inserting the at least one terminal within the alignment aperture.

5. The electrical connector assembly of claim 4, wherein the shroud is movable laterally with respect to the housing and generally immovable in a direction normal to the circuit board.

6. The electrical connector assembly of claim 1, wherein the shroud includes a second alignment member configured to fix a second terminal with respect to the shroud.

7. The electrical connector assembly of claim 6, wherein the second alignment member is a portion of the shroud having a second alignment aperture therein, the second terminal received in the second alignment aperture.

8. The electrical connector assembly of claim 1, wherein the shroud is movable relative to the housing.

9. The electrical connector assembly of claim 8, wherein the shroud is integrally formed with the housing.

10. The electrical connector assembly of claim 8, wherein the electrical connector assembly further comprises a seal located between the shroud and the housing.

11. An electrical connector assembly comprising:
    a housing defining a housing aperture;
    at least one terminal accessible through the housing aperture; and
    a shroud generally aligned with the housing aperture, the shroud defining a shroud aperture configured to receive the at least one terminal and the shroud being movable relative to the housing and the at least one terminal to facilitate positioning the shroud relative to the at least one terminal.

12. The electrical connector assembly of claim 11, wherein the shroud is molded into the housing aperture.

13. The electrical connector assembly of claim 12, wherein material utilized to mold the shroud within the housing aperture forms a seal between the shroud and the housing.

14. The electrical connector assembly of claim 12, wherein the at least one terminal is located within the shroud aperture, and wherein material utilized to mold the shroud within the housing aperture seals the shroud aperture.

15. The electrical connector assembly of claim 14, wherein the at least one terminal pierces through the mold material.

16. The electrical connector assembly of claim 12, wherein material utilized to mold the shroud within the housing aperture is a thermal plastic elastomeric resin.

17. The electrical connector assembly of claim 11, further comprising a seal located between the shroud and the housing.

18. The electrical connector assembly of claim 17, wherein the shroud, the seal, and at least a portion of the housing are integrally formed.

19. The electrical connector assembly of claim 17, wherein the seal is molded on the shroud.

20. The electrical connector assembly of claim 11, wherein the at least one terminal is fixed to a circuit board at least partially retained within the housing.

21. The electrical connector assembly of claim 11, wherein the shroud includes an alignment member configured to fix the at least one terminal relative to the shroud.

22. The electrical connector assembly of claim 21, wherein the alignment member is a portion of the shroud having an alignment aperture therein, the at least one terminal received in the alignment aperture.

23. The electrical connector assembly of claim 22, wherein the at least one terminal is a pin.

24. The electrical connector assembly of claim 11, wherein the shroud includes a flange captured by a shoulder formed in the housing.

25. An electrical connector assembly comprising:
    a housing defining a housing aperture;
    at least one terminal pin accessible through the housing aperture; and
    a shroud including an alignment aperture, the at least one terminal pin received in the alignment aperture to fix the at least one terminal pin relative to the shroud, and wherein the shroud is movably coupled to the housing to facilitate inserting the at least one terminal pin into the alignment aperture.

26. The electrical connector assembly of claim 25, wherein the shroud is molded into the housing aperture.

27. The electrical connector assembly of claim 25, wherein the shroud includes a flange captured by a shoulder formed in the housing.

28. The electrical connector assembly of claim 25, wherein the shroud is integrally formed with the housing.

29. The electrical connector assembly of claim 25, wherein the at least one terminal pin is fixed with respect to a circuit board at least partially retained within the housing.

30. The electrical connector assembly of claim 11, wherein the at least one terminal is a pin.

31. The electrical connector assembly of claim 11, wherein the at least one terminal includes a plurality of terminals.

32. The electrical connector assembly of claim 2, wherein the shroud defines a shroud aperture, wherein the alignment aperture is positioned within the shroud aperture, and wherein the at least one terminal includes a plurality of terminals received within the shroud aperture, one of the plurality of terminals received in the alignment aperture.

33. The electrical connector assembly of claim 25, wherein the shroud defines a shroud aperture, wherein the alignment aperture is positioned within the shroud aperture, and wherein the at least one terminal pin includes a plurality of terminal pins received within the shroud aperture, one of the plurality of terminal pins received in the alignment aperture.

* * * * *